United States Patent [19]

Arguello

[11] 4,057,740
[45] Nov. 8, 1977

[54] CONSTANT DUTY CYCLE MONOSTABLE

[75] Inventor: Leonard E. Arguello, San Jose, Calif.

[73] Assignee: W. R. Grace & Co., New York, N.Y.

[21] Appl. No.: 716,612

[22] Filed: Aug. 23, 1976

[51] Int. Cl.$^2$ .................. H03K 17/00; F02P 1/00
[52] U.S. Cl. .................................. 307/273; 307/289;
307/358; 123/148 E
[58] Field of Search ............. 307/247, 273, 274, 228,
307/247, 357, 356, 358, 6, 5; 123/148 E

[56] References Cited

U.S. PATENT DOCUMENTS

| | | | |
|---|---|---|---|
| 2,997,665 | 8/1961 | Sylvan | 307/228 |
| 3,049,625 | 8/1962 | Brockman | 307/228 |
| 3,255,221 | 12/1965 | Scott, Jr. | 307/228 |
| 3,288,929 | 11/1966 | Hutchinson | 307/358 |
| 3,378,701 | 4/1968 | Frank | 307/247 UX |

Primary Examiner—Stanley D. Miller, Jr.
Assistant Examiner—B. P. Davis
Attorney, Agent, or Firm—Kenneth E. Prince; William Kovensky

[57] ABSTRACT

A circuit that functions as a monostable multivibrator and has a constant duty cycle regardless of the frequency of the input trigger signal is particularly useful in electronic ignition systems for internal combustion engines.

6 Claims, 4 Drawing Figures

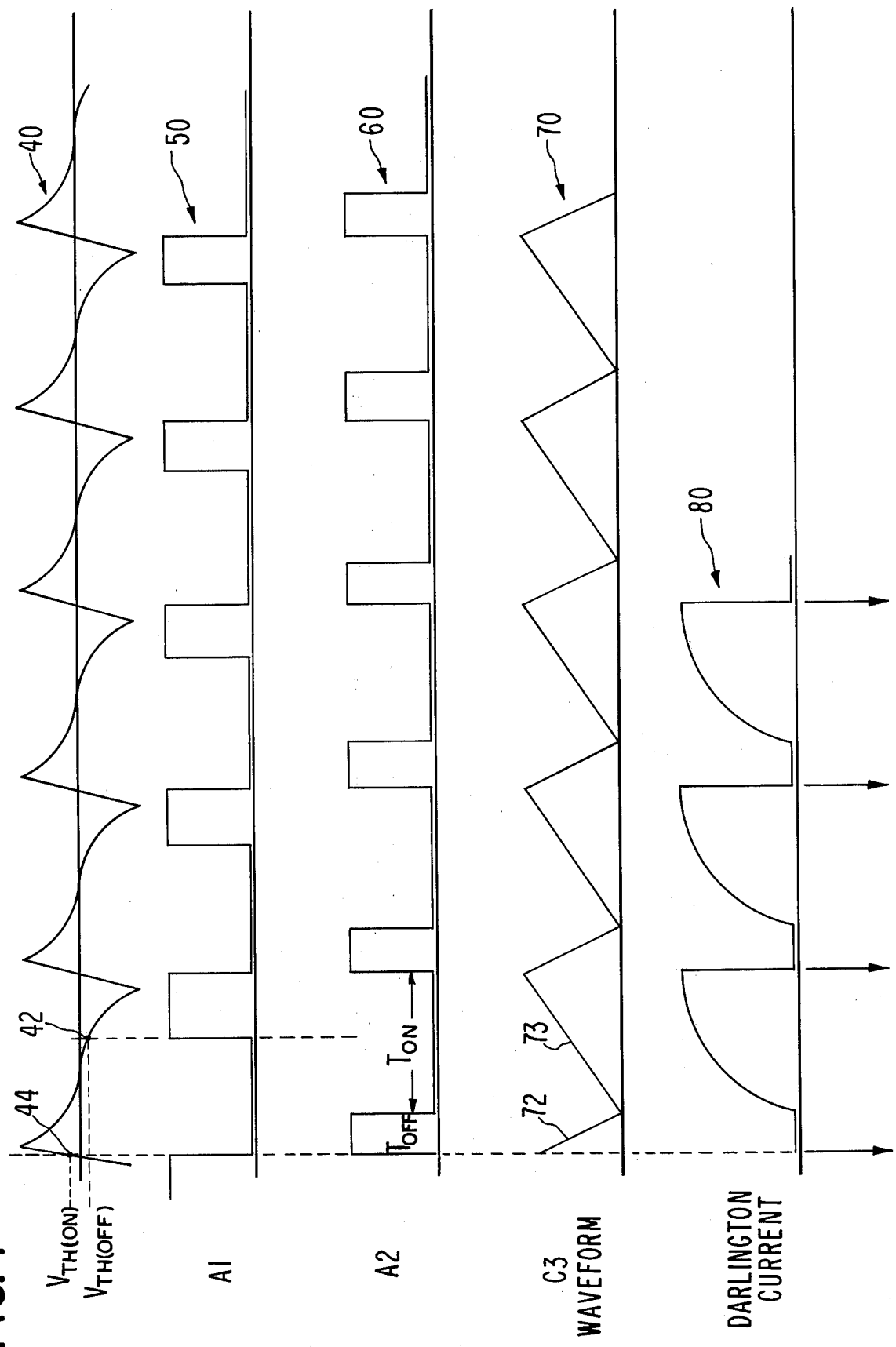

CONSTANT DUTY CYCLE MONOSTABLE

BACKGROUND OF THE INVENTION

1. Field of the Invention

This invention relates to monostable multivibrators. In particular, this invention relates to a circuit that functions as a monostable multivibrator and has a constant duty cycle.

2. Description of the Prior Art

The term multivibrator refers to a two-stage amplifier with positive feed-back. A flip-flop is a bistable multivibrator; a "one-shot" switching circuit is a monostable multivibrator; and a free-running oscillator is an astable multivibrator. As the term indicates a monostable multivibrator has one stable state. When a trigger input pulse is applied, the monostable multivibrator switches from its stable to its unstable state where it generates an output pulse and remains in the unstable state for a predetermined time before returning to its original stable state. This feature makes the monostable multivibrator useful in standardizing pulses of random widths or in generating time-delayed pulses. The monostable circuit is somewhat similar to that of a flip-flop except that one of two cross-coupled metworks permits a-c coupling only. This means that the circuit remains in its unstable state only until a reactive component, such as a capacitor, discharges, after which the monostable returns to its stable state and the output pulse generated during the unstable state has a predetermined width.

The duty cycle of a monostable multivibrator is generally defined as the ratio of the time the monostable is in its stable state before being triggered to the sum of the time the monostable is in its stable state plus the time it is in an unstable state, when it generates an output pulse. Previous duty cycles of monostable multivibrators have varied with the input frequency of the trigger pulses that cause the monostable to switch from its stable to its unstable and produce an output pulse. Usually the unstable state is of a fixed time period, while the time period of the stable state is a function of the frequency of the input switching signal. A variable frequency input signal causes a variable duty cycle.

In some applications, it is desirable that the duty cycle remain constant, that is, the duty cycle not vary with the frequency of the input signal. In applications such as electronic ignition systems for internal combustion engines, for example, the duty cycle should remain constant as explained hereafter.

The dwell angle in automobile ignition systems is the number of angular degrees that the distributor shaft rotates while the contact points in the distributor remain closed. At certain points during rotation of the distributor shaft, lobes on the distributor cam open the contact points and trigger the primary side of an ignition coil. The dwell time is the length of time for the distributor shaft to rotate through the dwell angle. The dwell angle is constant, but the dwell time varies with engine speed. However, the ratio of the dwell time to the dwell time plus the time the contact points are held open by the cam lobes, that is, the trigger pulse time, is a constant.

In order to convert conventional point-contact ignition systems in automobile engines to electronic, it is desirable that the timing of the electrical pulses generated to fire the spark plugs be similar to the timing of pulses generated by point-contact ignition systems. Although dwell time in conventional point-contact ignition systems decreases as engine speed increases, the dwell angle remains constant, and the ratio of dwell time to dwell time plus time contact points are open, that is, the trigger pulse time, is a constant. These same characteristics should be present in an electronic ignition system. Dwell time is equivalent to the time the monostable multivibrator is in a stable state. The time the contact points are held open is equivalent to the time period of the output pulse generated by the monostable multivibrator in its unstable state.

A monostable multivibrator is an ideal pulse generator circuit for use in an electronic ignition system, because the former produces pulses of a predetermined voltage level and width in response to incoming trigger signals. For the pulses generated by the monostable multivibrator in an electronic ignition system to function substantially equivalent to those generated by the point-contact ignition system, the duty cycle of the monostable multivibrator must be constant. Unfortunately, the duty cycle of prior-art monostable multivibrators varies with the frequency of the input signal, and such operation is not functionally equivalent to that of the conventional point-contact ignition system. Thus, there is a need for a circuit that generates pulses like a monostable multivibrator and has a constant duty cycle.

BRIEF DESCRIPTION OF THE INVENTION

The circuit of the invention overcomes the disadvantages of prior-art monostable multivibrators in that it functions as a monostable multivibrator and has a duty cycle that is constant regardless of whether the frequency of the incoming trigger pulse varies. Briefly, the circuit comprises a flip-flop having a pair of inputs and an inversion output, a comparator circuit coupled to one input of the flip-flop, a storage capacitor coupled with another input of the flip-flop, a means for charging the storage capacitor during the time the flip-flop is in a first position, and a means for discharging the capacitor during the time the flip-flop is in a second position, with the rate of charge and the rate of discharge of the capacitor being a constant, so that the ratio of the time the flip-flop is in the first position to the time the flip-flop is in the first and second positions is a constant.

BRIEF DESCRIPTION OF THE DRAWINGS

FIG. 4 is a simplified timing diagram of an electronic ignition system incorporating the monostable multivibrator of the invention.

DESCRIPTION OF THE PREFERRED EMBODIMENTS

Figure 1:
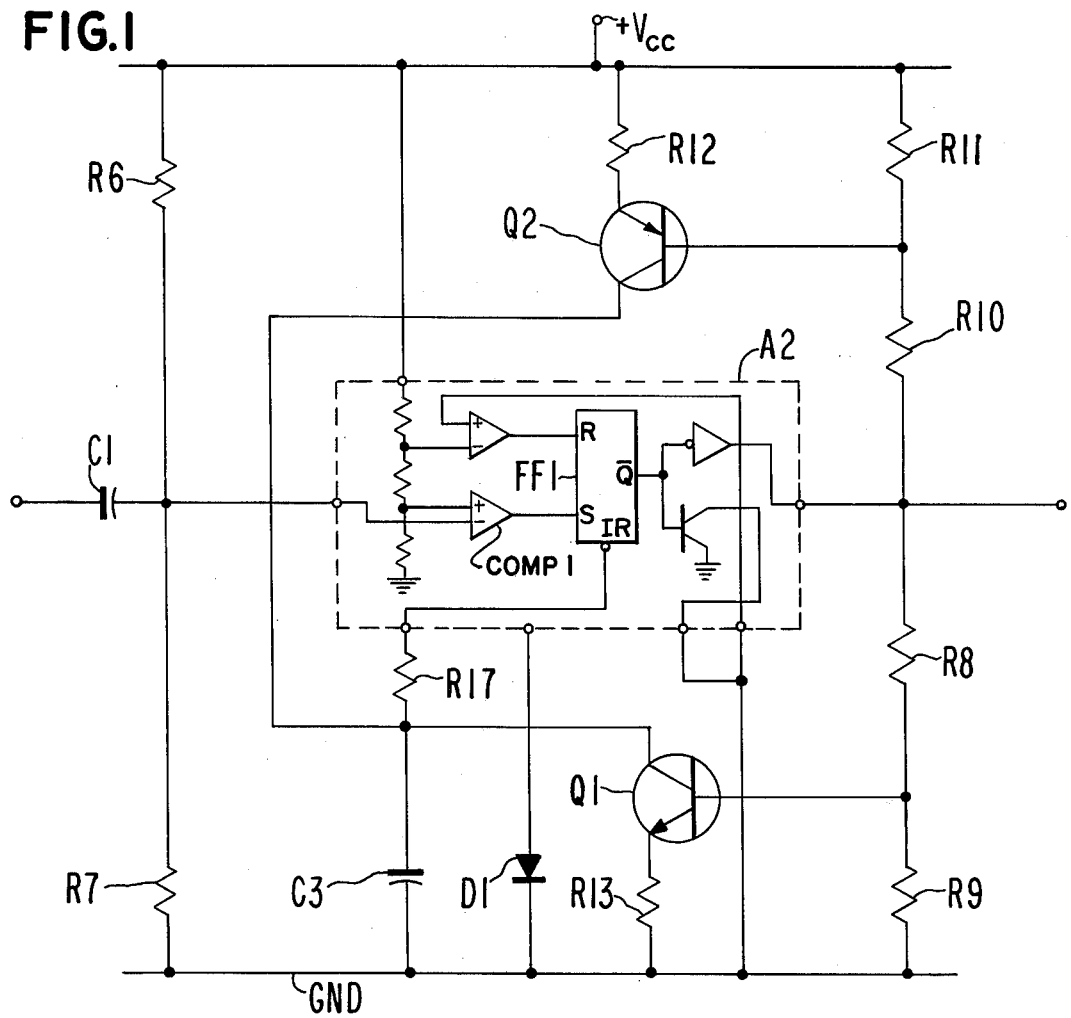
FIG. 1 is a simplified schematic drawing of the invention showing the flip-flop, a comparator coupled to one input of the flip-flop, a storage capacitor coupled to another input of the flip-flop, a current source for charging the capacitor during the time the flip-flop is in a first position, and a current source for discharging the capacitor during the time the flip-flop is in a second position.

Referring to FIG. 1, the circuit of the invention that functions as a monostable multivibrator and has a constant duty cycle comprises a flip-flop FF1 having a plurality of inputs, such as set input S, reset input R, and inhibitor reset input IR, and an output, such as output $\overline{Q}$.

As known in the art, a flip-flop comprises a pair of cross-coupled amplifiers, such as transistors. When one transistor is conducting, referred to as "on," the other transistor is nonconducting, referred to as "off." An incoming signal of a predetermined voltage level applied to the base of the nonconducting "off" transistor will cause it to turn on and cause the conducting transistor to turn off, that is, to stop conducting.

A comparator circuit COMP 1 is coupled to an input, such as input S, of flip-flop FF1. As known in the art, a comparator circuit receives an input signal and determines whether the signal is at least of a predetermined level. If so, the comparator generates an output signal. Suitably, the combination of the flip-flop FF1 and comparator circuit COMP 1 are formed on a monolithic chip of semiconductor material as an integrated circuit, such as the 555 single timing circuit manufactured by Fairchild.

Coupled to another input, such as input IR, of flip-flop FF1 via resistor R17 is the positive terminal of a timing and storage capacitor C3. Capacitor C3 is selected so that the rate at which it is charged and the rate at which it is discharged are constant; however, the level to which capacitor C3 is charged depends upon the time period of the input signal to input S of flip-flop FF1. By way of example, capacitor C3 is about 22 microfarads, and can store up to about 5 volts.

Also coupled to the positive terminal of capacitor C3 are two current sources, one for charging capacitor C3, and the other for discharging capacitor C3 in response to output signals from flip-flop FF1. The charging current source comprises PNP transistor Q2, whose collector is coupled to the positive side of capacitor C3, and whose base is coupled via resistor R11 to the supply voltage Vcc as well as via resistor R10 to the output $\overline{Q}$ of flip-flop FF1. The emitter of transistor Q2 is coupled via resistor R12 to a supply voltage Vcc. By way of example, transistor Q2 is a PN 2907A transistor, resistor R10 is 30,000 ohms, resistor R11 is about 10,000 ohms and resistor R12 is about 1,600 ohms.

The second current source comprises an NPN transistor Q1, whose collector is coupled to the positive side of capacitor C3, whose base is coupled via resistor R8 to the output Q of flip-flop FF1 and to ground via resistor R9, and whose emitter is coupled via resistor R13 to ground. By way of example, transistor Q1 is a PN 2222A transistor, resistor R8 is about 18,000 ohms, resistor R9 is about 10,000 ohms, and resistor R13 is about 390 ohms. Transistors Q1 and Q2 are selected so that their characteristics are complementary and, along with resistors R9 through R13, cause the circuit to operate with a constant duty cycle.

During operation, the circuit is in its first, or stable, state, when flip-flop FF1 is in its reset position and its output signal is approximately six tenths of a volt, or less. With the output $\overline{Q}$ of flip-flop thus low, transistor Q2 is conducting. A positive bias voltage from supply voltage Vcc via resistor R11 applied to the base of transistor Q2 keeps it turned on, so that current flows from the emitter to the collector of transistor Q2 and to the positive side of capacitor C3 to charge it at a constant linear rate. The low output Q of flip-flop FF1 also causes a reverse-bias voltage via resistor R8 to appear at the base of transistor Q1 and keeps transistor Q1 from conducting, that is, keeps it turned off.

Resistors R6 and R7 coupled between supply voltage Vcc and ground keep a positive-bias voltage on the input to comparator COMP 1. When an incoming signal causes the voltage on the input to comparator COMP 1 to drop to a predetermined level, such as approximately one volt, or less, comparator COMP 1 sends a signal to input S of flip-flop FF1, causing flip-flop FF1 to switch to a second, or unstable, state and generate an output signal at output $\overline{Q}$ of about five volts. This output voltage plus any additional voltage from the supply voltage Vcc via resistors R8, R10, and R11 means that there is sufficiently high voltage applied to the base of transistor Q1 to turn it on and allow conduction to occur between its collector and emitter. Since the positive side of capacitor C3 is coupled to the collector of transistor Q1 and the emitter of transistor Q1 is coupled to ground by resistor R13, once transistor Q1 is conducting, capacitor C3 begins discharging at a constant, linear rate through transistor Q1 any electrical potential stored in capacitor C3.

Capacitor C3 continues to discharge through transistor Q1 until the voltage level in capacitor C3 hits a predetermined minimum value, such as approximately six tenths of a volt. Because the positive side of capacitor C3 is coupled via resistor R17 to input IR of flip-flop FF1, a low-voltage signal of about six tenths of a volt from the positive output terminal of capacitor C3 causes the flip-flop FF1 to switch from its second, or unstable, state back to its first, or stable, state. When flip-flop FF1 switches back to its first state, the output signal at output $\overline{Q}$ drops to about six tenths of a volt. A low-voltage signal from output $\overline{Q}$ of flip-flop FF1 is in turn applied via resistor R8 to the base of transistor Q1, which causes it to turn off and stop conducting. Once transistor Q1 stops conducting, capacitor C3 stops discharging and begins to recharge.

Because the charge current from transistor Q2 to capacitor C3 is proportional to the discharge current from C3 through transistor Q1, regardless of the frequency of the input signal to comparator COMP 1, the ratio of the time flip-flop FF1 is in its first, or stable, state to the sum of the time flip-flop FF1 is in its first state and the time flip-flop FF1 is in its second, or unstable, state is a constant. In other words, the ratio of the time transistor Q1 is turned off to the sum of the time transistor Q1 is turned off and the time transistor Q1 is turned on is a constant. In electronic ignition system applications, the time that transistor Q1 is turned off is electrically equivalent to the dwell time, and can be represented by the symbol $T_{on}$. The time that transistor Q1 is turned on is electrically equivalent to the time period a cam lobe holds the contact points open, and can be represented by the symbol $T_{off}$. For an eight-cylinder engine, dwell angle is the ratio of $T_{on}$ to the sum of $T_{on}$ and $T_{off}$ multiplied by 45°, that is, dwell = $[T_{on}/(T_{on} + T_{off})] \times 45°$. Because the ratio of $[T_{on}/(T_{on} + T_{off})]$ is a constant, it follows that dwell = $K$ where $K$ represents another constant.

The charge current $I_c$ is expressed as $I_c = C\, dV/dT_{on}$ and the discharge current $I_d$ is expressed as $I_d = C\, dV/dT_{off}$, where $C$ is the capacitance of capacitor C3, $dV$ is the change in voltage in capacitor C3 during charge or discharge, $dT_{on}$ is the period capacitor C3 is charging and transistor Q1 is turned off, and $dT_{off}$ is the time period capacitor C3 is discharging and transistor Q1 is turned on.

Because the capacitance of capacitor C3 is a fixed value we can write $C = I_d dT_{off}/dV = I_c dt_{on}/dV$. If the change in voltage to charge or discharge capacitor C3 is the same, then we can write $I_d\, dT_{off} = I_c\, dT_{on}$, or $dT_{on}/dT_{off} = I_d/I_c$. It follows that the ratio of $T_{on}$ to $T_{off}$ is set by the ratio of the current when transistor Q1 is turned on to the current when transistor Q1 is turned off. The discharge current $I_d$ is expressed as $I_d = (V_1 - V_{Be1})/R13$, where $V_1$ is the voltage across resistor R9, and $V_{Be1}$ is the emitter-to-base voltage across transistor Q1 when it is conducting. The charge current $I_c$ is expressed as $I_c = (V_2 - V_{Be2})/R12$ where $V_2$ is the voltage across resistor R11 and $V_{Be2}$ is the emitter-to-base voltage across transistor Q2 when transistor Q1 is turned off. Transistors Q1 and Q2 are selected so that they have similar electrical characteristics that is, are complementary and resistors R8, R9, R10 and R11 are selected so that $V_1 = V_2$. It follows that $I_d/I_c = (1/R13)/(1/R12)$, or $I_d/I_c = R12/R13$ and $dT_{on}/dT_{off} = R12/R13$. By proper setting of R8, R9, R10, and R11, the ratio of $T_{on}/(T_{on} + T_{off})$ becomes $R12/(R12 + R13)$ and the duty cycle is set by the ratio of the resistance value of two resistors, R12 and R13.

Figure 2:
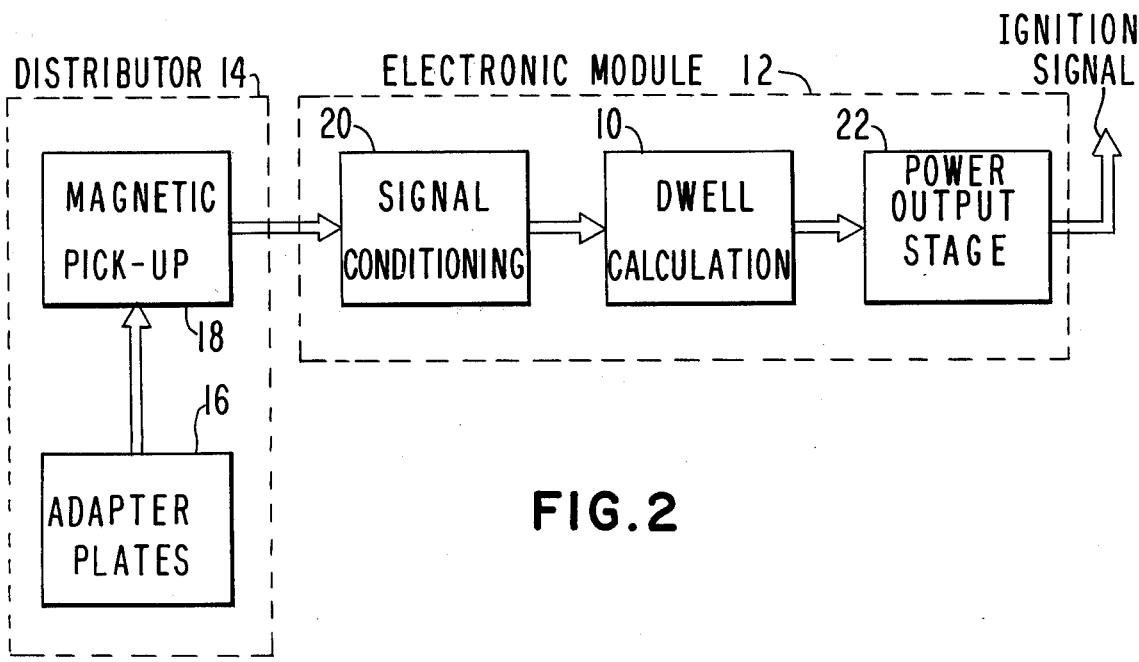
FIG. 2 is a simplified block diagram of an application of the constant duty cycle monostable multivibrator of the invention.

Referring to FIG. 2, the circuit of the invention that functions as a monostable multivibrator and has a constant duty cycle is useful in electronic ignition system applications, such as for the dwell calculation unit 10 of the electronic module 12. Signals are picked up in the distributor 14 through the use of adapter plates 16 and a magnetic pick-up unit 18 and are sent to the electronic module 12, where they are received by the signal conditioning unit 20, transferred to the dwell calculation unit 10 and processed as explained previously for the circuit of the invention, sent to a power output stage unit 22, and then transmitted on as ignition signals to fire the spark plugs.

Figure 3:
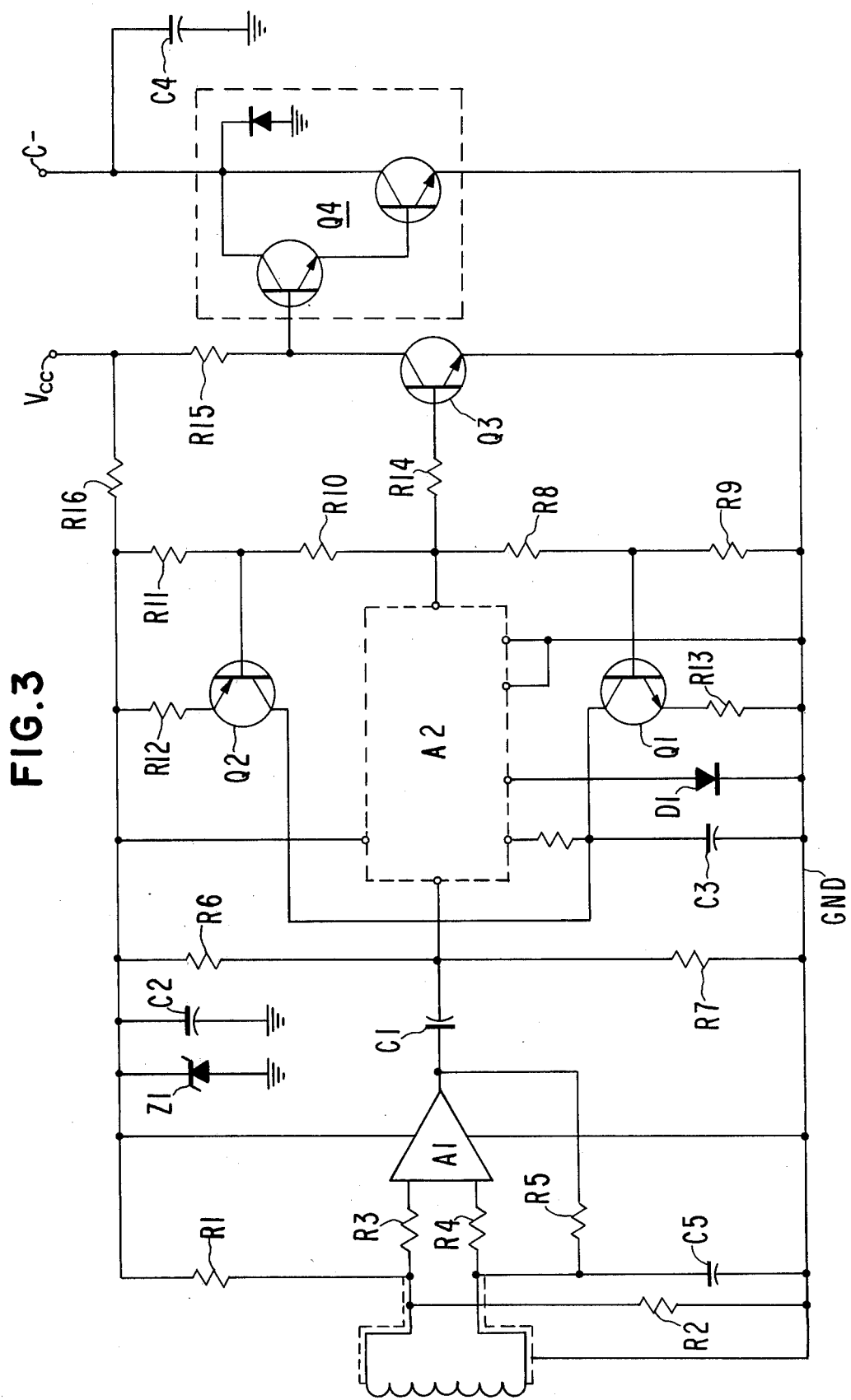
FIG. 3 is a simplified schematic diagram of the monostable multivibrator in an electronic ignition system.

Referring to FIG. 3, a simplified schematic drawing of the electronic module 12 of FIG. 2, the signal conditioning unit 20 comprises an operational amplifier A1, which receives input signals from the magnetic pick-up unit 18 in the distributor 14 for conditioning and transmission as input trigger signals to the comparator portion of the timing circuit A2 (See FIG. 1). Suitably, operational amplifier A1 comprises a UA741 operational amplifier, or equivalent, manufactured by Fairchild. Resistors R1 and R2 provide a bias for one input to operational amplifier A1. Resistors R3 and R4, which are coupled between the magnetic pick-up 18 and each of the inputs to the operational amplifier A1 protect the latter from damage caused by excessive voltage from the magnetic pick-up unit 18. Resistor R5 provides regenerative feed-back to improve the switching speed of the operational amplifier A1 and provide the system with noise immunity. Capacitor C5 prevents power supply noise coming through the operational amplifier A1 from being applied to the nonintruding input and causing spurious signals to be generated that would affect the system's operation. The output of operational amplifier A1 is differentiated by capacitor C1 and resistors R6 and R7 and coupled to an input terminal of the comparator portion of the timing circuit A2 (See FIG. 1).

The signal conditioning unit 20 functions to sense any low-level output from the magnetic pick-up unit 18, which occurs whenever a cam lobe in the distributor 14 is aligned with a pick-up pole piece. The operational amplifier A1 compares this output with a preset threshold on one of its inputs. Whenever the input from the magnetic pick-up 18 exceeds the threshold amount, the operational amplifier A1 changes states very rapidly and remains in the new state until the signal from the magnetic pick-up 18 drops below a second threshold value. The difference between its two threshold values provides the required hysteresis to ensure some degree of noise immunity.

In the dwell calculation unit 10, resistor R17 is coupled between the input IR of the flip-flop FF1 portion of timing unit A2 (See FIG. 1) and one side of capacitor C3 to protect input IR from excessive current flowing into it by the sudden discharge of capacitor C3 caused by parasitic elements within the timing circuit itself. The output of the timing circuit A2 is coupled via transistor R14 to the base of transistor Q3. Suitably, transistor Q3 is an NPN transistor, such as a 2N2222A transistor. The collector of the transistor Q3 is coupled to the supply voltage Vcc via resistor R15, and the emitter of transistor Q3 is coupled to ground. Transistor Q3 in conjunction with resistors R14 and R15 form the driver stage and provide sufficient current to drive transistor Q4 in and out of saturation. Transistor Q4 is a monolithic Darlington device with diffused base depletion resistors and a built-in collector diode clamp for protection from negative-going transients. Capacitor C4 provides improved fouled-plug performance. Resistor R16 in conjunction with zener diode Z1 and capacitor C2 provide the circuit with a voltage regulated line, which is necessary to ensure consistent threshold and dwell for various battery supply levels.

Referring to FIG. 4, the waveforms of various input and output pulses to and from units in the electronic module 12 are shown. The top line 40 comprises a series of pulses from the output of the magnetic pick-up unit 18 (See FIG. 2). The next line 50 indicates the output from the operational amplifier A1 portion of the signal conditioning unit 20 in response to signals from the magnetic pick-up unit 18. Note that whenever an output pulse from the magnetic pick-up unit 18 drops below a first threshold lever 42, the operational amplifier A1 generates an output pulse. Whenever an output pulse from the magnetic pick-up unit 18 rises above a second threshold level 44 the operational amplifier A1 output returns to a low level.

The third line 60 indicates the output from the flip-flop FF1 portion of timing circuit A2 of the dwell calculation unit 10 (See FIGS. 1, 2, and 3). When an output pulse from operational amplifier A1 goes from a high to a low level, an output pulse from timing circuit A2 is generated.

The fourth line 70 illustrates the output from timing and storage capacitor C3 (See FIG. 1). Note that during the time that the timing circuit A2 is generating an output pulse (line 60), capacitor C3 is discharging, as can be seen from the negative slope 72 of the waveforms on line 70. When the output of timing circuit A2 drops back to a low level as indicated on line 60, capacitor C3 begins charging again, as can be seen from the positive slope 73 of the waveforms on line 70. Each time that timing circuit A2 generates an output pulse, capacitor C3 is discharging.

The fifth line 80 indicates the shape of the output current pulses from the Darlington unit, which are transmitted to the ignition for distribution to fire the spark plugs.

While the invention has been described with reference to an application in an electronic ignition system, it will be appreciated that the circuit of the invention can be used in numerous other applications which will be obvious to one skilled in the art.

I claim:

1. Monostable multivibrator circuit with constant duty cycle comprising:

a flip-flop having a first input for switching the flip-flop to a first state, a second input for switching the flip-flop to a second state, and an output;

a comparator means coupled to the first input and capable of generating an output signal when an input signal applied thereto reaches a predetermined level;

a timing and storage means coupled to the second input of said flip-flop;

a charging means coupled to the timing and storage means; and, a discharging means coupled to the timing and storage means and responsive to output signals from the flip-flop, whereby said timing and storage means is charged by said charging means and is discharged responsive to receipt of an output signal from said flip-flop, and whereby said flip-flop produces its output signal responsive to receipt of an output signal from said comparator means.

2. Circuit of claim 1 wherein said comparator means comprises a comparator.

3. Circuit of claim 1 wherein said timing and storage means comprises a capacitor with a first side coupled to the second input, and a second side coupled to ground.

4. Circuit of claim 3 wherein said charging means comprises a first transistor whose collector is coupled to the first side of the capacitor, whose emitter is coupled through a resistor to a supply voltage, and whose base is coupled through a resistor to a supply voltage.

5. Circuit of claim 3 wherein said discharging means comprises a second transistor whose collector is coupled to the first side of the capacitor, whose emitter is coupled through a resistor to ground, and whose base is coupled through a resistor to the output of the flip-flop and through additional resistors to a supply voltage.

6. Circuit of claim 1, wherein said circuit is associated with the ignition for an internal combustion engine, said inputs including the ignition timing pick-up means of said engine, and the outputs from said flip-flop operating the firing means for the spark plugs of said engine.

* * * * *